(12) United States Patent
Pinto et al.

(10) Patent No.: US 7,245,556 B1
(45) Date of Patent: Jul. 17, 2007

(54) METHODS FOR WRITING NON-VOLATILE MEMORIES FOR INCREASED ENDURANCE

(75) Inventors: Yosi Pinto, Yokneam (IL); Geoffrey S. Gongwer, Los Altos, CA (US); Oren Honen, Yokneam (IL)

(73) Assignee: SanDisk Corporation, Sunnyvale, CA (US)

( * ) Notice: Subject to any disclaimer, the term of this patent is extended or adjusted under 35 U.S.C. 154(b) by 7 days.

(21) Appl. No.: 11/321,217

(22) Filed: Dec. 28, 2005

(51) Int. Cl.
*G11C 8/00* (2006.01)
(52) U.S. Cl. ...................................... 365/236; 365/218
(58) Field of Classification Search ................ 365/236, 365/218
See application file for complete search history.

(56) References Cited

U.S. PATENT DOCUMENTS

| 6,456,528 | B1   | 9/2002  | Chen              |         |
|-----------|------|---------|-------------------|---------|
| 7,120,729 | B2 * | 10/2006 | Gonzalez et al.   | 711/103 |
| 7,139,864 | B2 * | 11/2006 | Bennett et al.    | 711/103 |
| 7,173,863 | B2 * | 2/2007  | Conley et al.     | 365/189.05 |
| 7,177,184 | B2 * | 2/2007  | Chen              | 365/185.03 |
| 7,177,977 | B2 * | 2/2007  | Chen et al.       | 711/103 |
| 7,184,313 | B2 * | 2/2007  | Betser et al.     | 365/185.24 |

OTHER PUBLICATIONS

Bhat et al., "Balanced Gray Codes," *The Electronic Journal of Combinatorics*, vol. 3, 1996, #R25, pp. 1-11.

* cited by examiner

*Primary Examiner*—Tuan T. Nguyen
(74) *Attorney, Agent, or Firm*—Brinks, Hofer, Gilson, & Lione

(57) ABSTRACT

A memory system that incorporates methods of amplifying the lifetime of a counter made up of memory elements, such as EEPROM cells, having finite endurance. A relatively small memory made up of a number of individually accessible write segments, where, depending on the embodiment, each write segment is made up of a single memory cell or a small number of cells (e.g., a byte). A count is encoded so that it is distributed across a number of fields, each associated with one of the write segments, such that as the count is incremented only a single field (or, in the single bit embodiments, occasionally more than one field) is changed and that these changes are evenly distributed across the fields. The changed field is then written to the corresponding segment, while the other write segments are unchanged. Consequently, the number of rewrites to a given write segment is decreased, and the lifetime correspondingly increased, by a factor corresponding to the number of write segments used.

23 Claims, 3 Drawing Sheets

METHODS FOR WRITING NON-VOLATILE MEMORIES FOR INCREASED ENDURANCE

CROSS-REFERENCE TO RELATED APPLICATION

The present application is related to U.S. Application No. 11/320,916 of Pinto et al., entitled "System for Writing Non-Volatile Memories for Increased Endurance," which is filed concurrently with the present application and is hereby incorporated herein, in its entirety, by this reference.

BACKGROUND OF THE INVENTION

The present invention relates generally to mass digital data storage systems, and, more particularly, to systems and methods for using memories of limited endurance in situations requiring higher endurance levels.

The use of non-volatile memory systems, such as EEPROM memory or flash memory storage systems is increasing due to the compact physical size of such memory systems, and the ability for non-volatile memory to be repetitively reprogrammed. The compact physical size of flash memory storage systems facilitates the use of such storage systems in devices that are becoming increasingly prevalent. Devices using flash memory storage systems include, but are not limited to, digital cameras, digital camcorders, digital music players, handheld personal computers, and global positioning devices. The ability to repetitively reprogram non-volatile memory included in flash memory storage systems enables flash memory storage systems to be used and reused.

Although non-volatile memory or, more specifically, non-volatile memory storage cells such as those within EEPROM or flash memory systems may be repetitively programmed and erased, each cell or physical location may only be erased a certain number of times before the cell wears out. In some systems, a cell may be erased up to approximately ten thousand times before the cell is considered to be unusable. In other systems, a cell may be erased up to approximately one hundred thousand times or even up to a million times before the cell is considered to be worn out. When a cell is worn out, thereby causing a loss of use or a significant degradation of performance to a portion of the overall storage volume of the flash memory system, a user of the flash memory system may be adversely affected, as for example through the loss of stored data or the inability to store data.

The wear on cells, or physical locations, within a flash memory system varies depending upon how often each of the cells is programmed. If a cell or, more generally, a memory element, is programmed once and then effectively never reprogrammed, the wear associated with that cell will generally be relatively low. However, if a cell is repetitively written to and erased, the wear associated with that cell will generally be relatively high. As logical block addresses (LBAs) are used by hosts, e.g., systems which access or use a flash memory system, to access data stored in a flash memory system, if a host repeatedly uses the same LBAs to write and overwrite data, the same physical locations or cells within the flash memory system are repeatedly written to and erased, as will be appreciated by those of skill in the art.

When some cells are effectively worn out while other cells are relatively unworn, the existence of the worn out cells generally compromises the overall performance of the flash memory system. In addition to degradation of performance associated with worn out cells themselves, the overall performance of the flash memory system may be adversely affected when an insufficient number of cells which are not worn out are available to store desired data. Often, a flash memory system may be deemed unusable when a critical number of worn out cells are present in the flash memory system, even when many other cells in the flash memory system are relatively unworn.

These limitations can restrict the use of non-volatile memories with similar properties, in applications requiring an endurance level that may exceed the safe lifetime of the memory. For example, it is often desirable to have form of non-volatile memory on the controller of a memory card system for use as, say, a counter for use in monitoring operations in the system. As such, the non-volatile memory on the controller can be subjected to a much higher frequency of write or erase/write cycles than the memory cells in the memory portion. Consequently, if formed of the same memory technology as the memory, the non-volatile memory cells on the controller are likely to wear out sooner, ending or restricting the operability of the memory system before the main flash memory portion wears out. Further, as any non-volatile memory on the controller is likely to be relatively small, these is less latitude for re-mapping and other defect management techniques for increasing the lifetime.

Therefore, what is desired is a method and an apparatus for improving the longevity of non-volatile memories of limited lifetime. Although technological advances have improved the typical endurance of such memory elements, there still exist applications that could greatly benefit from ways to further increase the safe lifetime for such memories.

SUMMARY OF THE INVENTION

The present invention relates to a system and a method for storing data, such as a count or register value, on a non-volatile memory in a manner to increase the endurance of a memory technology. The count (or register value) is encoded as a binary count made up of a number of fields such that as the count is incremented, only a single field is changed. According to the embodiment, the field may be only a single bit or of a larger granularity, such as a byte or other relatively small write segment at which the memory can be accessed. More generally, the memory may be accessed through a larger number of bits, but only those segments that are to be updated are actually rewritten and, consequently, subjected to full amount of wear. By distributing the changes to the fields evenly (such as writing them cyclically), if there are N such fields, each field is only changed at every Nth increment. The fields are then stored on a corresponding set of N individually accessible non-volatile memory sections. As this results in a given such section only being rewritten for every Nth count, the lifetime of the counter is extend by a factor of N over that inherent in the particular memory technology.

For example, an exemplary embodiment uses a set of individually accessible byte size memory portions, with each byte (or just a portion of it) is used for each field of the encoded count. Another set of embodiments uses a bit-wise accessible EEPROM memory. The count is then encoded to the individual accessible fields so that as the count is incremented, the rewrites of the fields are evenly distributed. This technique could be used in applications such as a counter for control data maintained in a small non-volatile EEPROM memory formed on the controller of a non-volatile memory system, such as a flash memory card. Such control data is likely to be updated more frequently, and thus wear out memory cells more quickly, than user data stored in the flash memory. By use of the techniques from the present invention, the lifetime for memory storing such frequently updated data can be extended while still using the same technology as the cells used to store user data.

Additional aspects, advantages and features of the present invention are included in the following description of exemplary examples thereof. All patents, patent applications, articles, patent publications and other publications referenced herein are hereby incorporated herein in their entirety for all purposes.

BRIEF DESCRIPTION OF THE DRAWINGS

The invention may best be understood by reference to the following description taken in conjunction with the accompanying drawings in which:

FIG. 1b is a diagrammatic representation of a memory system, e.g., memory device 120 of FIG. 1a.

DETAILED DESCRIPTION OF EXEMPLARY EMBODIMENTS

A. Memory Organization and Basic Definitions

The present inventions are related to increasing endurance in memory systems that are capable of deteriorating in performance over time as the number of erase and write cycles increases. While the embodiments described herein describe non-volatile EEPROM-based memory systems, the various aspects of the present inventions are applicable to any type of storage medium susceptible to "wear". For example, an emerging type of non-volatile memory technology is phase-change memory. Information is stored by changing the phase of a given material. A number of other examples of such systems are given in U.S. patent application Ser. No. 10/841,379. Such systems also may be prone to "wear", where the storage medium is less capable of storing information as the number of times the medium has been cycled increases. The present inventions can be readily applied to such technologies.

In one embodiment, non-volatile memory storage cells within flash memory storage systems may be repetitively programmed and erased, although each cell may only be erased a certain number of times before the cell wears out. When a cell wears out, a relatively significant degradation of performance associated with the portion of the overall storage volume of the flash memory storage system that includes the worn out cell occurs, and data stored in that portion may be lost, or it may become impossible to store data in that portion. A number of methods of improving memory life are know, such as using "gentler" operating values or algorithms (such as in intelligent erase or programming processes), wear leveling (described, for example, in U.S. patent application Ser. No. 10/686,399, herein incorporated by reference in its entirety), using margin values (described, for example, in U.S. Pat. No. 5,532,962, herein incorporated by reference in its entirety), or operating multilevel memories in a binary mode (described, for example, in U.S. Pat. No. 6,456,528, herein incorporated by reference in its entirety). Although these and other techniques can improve how long the memory will last, it will still, eventually, show wear. This is particular true if a portion of the memory is dedicated to a specific use requiring it to be re-written more frequently than the other cells of the memory system formed of the same technology.

Figure 1A:
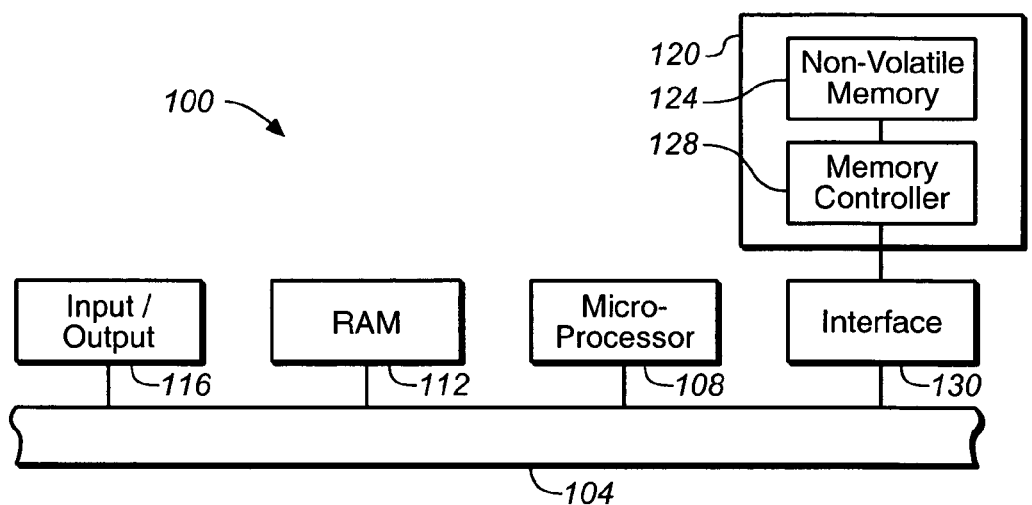
FIG. 1a is a diagrammatic representation of a general host system that includes a non-volatile memory device.

Referring initially to FIG. 1a, a general host system that includes a non-volatile memory device, e.g., a memory card such as a Compact Flash memory card, will be described. A host or computer system 100 generally includes a system bus 104 that allows a microprocessor 108, a random access memory (RAM) 112, and input/output circuits 116 to communicate. It should be appreciated that host system 100 may generally include other components, e.g., display devices and networking device, which are not shown for purposes of illustration.

In general, host system 100 may be capable of capturing or storing information including, but not limited to, still image information, audio information, and video image information. Such information may be captured in real-time, and may be transmitted to host system 100 in a wireless manner. While host system 100 may be substantially any system, host system 100 is typically a system such as a digital camera, a video camera, a cellular communications device, portable computing device, an audio player, or a video player. It should be appreciated, however, that host system 100 may generally be substantially any system which stores data or information, and retrieves data or information. It may also be a system that either only captures data or only retrieves data. That is, host system 100 may be a dedicated system that stores data, or host system 100 may be a dedicated system that reads data. By way of example, host system 100 may be a memory writer that is arranged only to write or store data. Alternatively, host system 100 may be a device such as an MP3 player that is typically arranged to read or retrieve data, and not to capture data.

A non-volatile memory device 120 is arranged to interface with bus 104 to store information. An optional interface circuit block 130 may allow non-volatile memory device 120 to communicate with bus 104. When present, interface circuit block 130, e.g., and interface, serves to reduce loading on bus 104. Non-volatile memory device 120 includes non-volatile memory 124 and a memory control system 128. In one embodiment, non-volatile memory device 120 may be implemented on a single chip or a die. Alternatively, non-volatile memory device 120 may be implemented on a multi-chip module, or as multiple discrete components. One embodiment of a non-volatile memory device 120 will be described below in more detail with respect to FIG. 1b. Non-volatile memory device 120 may be substantially any suitable non-volatile memory device, e.g., a removable memory card or an embedded sub-system.

Non-volatile memory 124 is arranged to store data such that data may be accessed and read as needed. The processes of storing data, reading data, and erasing data are generally controlled by memory control system 128. In one embodiment, memory control system 128 manages the operation of non-volatile memory 124 such that its lifetime is substantially maximized by essentially causing sections of non-volatile memory 124 to be worn out substantially equally.

Non-volatile memory device 120 has generally been described as including a memory control system 128, i.e., a controller. Specifically, non-volatile memory device 120 may include separate chips for non-volatile memory 124 and controller 128 functions. By way of example, while non-volatile memory devices including, but not limited to, PC cards, CompactFlash cards, MultiMedia cards, and Secure Digital cards include controllers which may be implemented on a separate chip, other non-volatile memory devices may not include controllers that are implemented on a separate chip. In an embodiment in which non-volatile memory device 120 does not include separate memory and controller chips, the memory and controller functions may be integrated into a single chip. Additionally, the controller may be located on the host system, and the non-volatile memory device 120 connected to the controller on the host through a connector or any other type of interface. Regardless, the scope of the present inventions encompasses all different forms and combinations of a memory system, wherein the level of wear within a memory medium is controlled by a control system. For example, the controller may be implemented within software on the microprocessor of the host system.

Figure 1B:
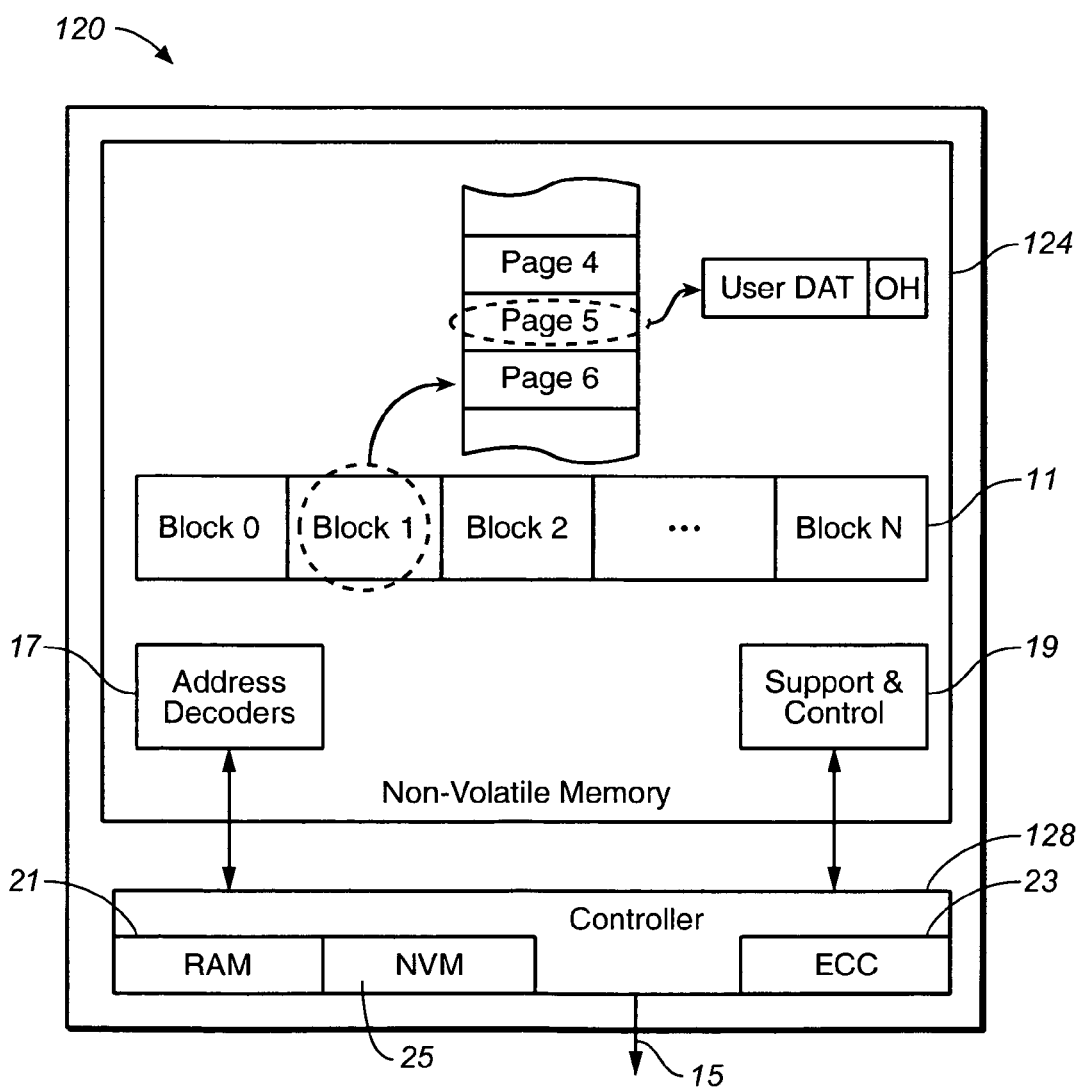

With reference to FIG. 1b, one example of a non-volatile memory device 120 will be described in more detail. It should be appreciated that FIG. 1b shows an embodiment of non-volatile memory device 120 that includes a single flash memory chip 124 and a separate controller 128. Memory 124 may be an array of memory cells along with suitable addressing and control circuitry formed on a semiconductor substrate, wherein one or more bits of data are stored in the individual memory cells by storing one of two or more levels or distributions of charge in individual memory elements of the memory cells. A non-volatile flash electrically erasable programmable read only memory (EEPROM) is an example of a common type of memory for such systems.

In the described embodiment, controller 128 communicates over a bus 15 to a host computer or other system that is using the memory system to store data. Bus 15 is generally a part of bus 104 of FIG. 1a. Control system 128 also controls operation of memory 124, which may include a memory cell array 11, to write data provided by the host, read data requested by the host and perform various housekeeping functions in operating memory 124. Control system 128 may include a general-purpose microprocessor or microcontroller that has associated memory, various logic circuits, and the like. One or more state machines are often also included for controlling the performance of specific routines.

Memory cell array 11 is typically addressed by control system 128 through address decoders 17. Decoders 17 may apply the correct voltages to word and bit lines of array 11 in order to program data to, read data from, or erase a group of memory cells being addressed by the control system 128. Additional circuits 19 may include data registers to temporarily store data being read or written, programming drivers that control voltages applied to elements of the array that depend upon the data being programmed into an addressed group of cells, and state machines to control sequencing of the various voltages and control signals. These support and control circuits 19 may also include some amount of non-volatile memory for counters or other control information. Circuits 19 may also include sense amplifiers and other circuits necessary to read data from an addressed group of memory cells. Data to be programmed into array 11, or data recently read from array 11, are typically stored in a buffer memory 21 within control system 128. Control system 128 also usually contains various registers for temporarily storing command and status data, and the like. Control system 128 many also some amount of non-volatile memory 25 where it can store various control data that it wants to maintain even when powered down. In other cases, the control system 128 may keep any such permanent records in non-volatile memory 124.

In one particular embodiment, array 11 is divided into a large number of BLOCKS 0–N of memory cells. In the preferred embodiment, a block is a unit of erase, the minimum number of memory cells that are erased together. Each block is typically divided into a number of pages, as also illustrated in FIG. 1b. A page is the minimum unit of programming and one or more sectors of user data are typically stored within each page. A sector is the smallest unit of logical data that the host will address or transfer to or from the non-volatile memory. In disk drive applications this is typically 512 bytes. Some non-volatile memories allow partial page programming in which the individual bits remaining in an erased state after a first programming can be programmed in subsequent page program operations without first erasing the page. Some multi-state memories may even allow bits already programmed in a lower programmed state to be programmed into a higher state in subsequent page program operations. In these memories, sectors or even portions of sectors may be programmed at different times. Nevertheless, one page remains the basic unit of programming; it is just that some bits may be masked out and programmed later. The present inventions can be applied to any suitable memory system regardless of the physical implementation of the units of erase, read and/or write.

As shown in FIG. 1b of the described embodiment, one page may include both user data and overhead data. Overhead data typically includes an error correction code (ECC) that has been calculated from the user data contained in the page, and the ECC may include some or all of the overhead data. A portion 23 of the control system 128 calculates the ECC when data is being programmed into array 11, and also checks the ECC when data is being read from array 11. Overhead data may also include the logical address of the user data, the physical addresses of the page and/or block, address map information, the number of erase cycles experienced by the physical block, encryption information and/or other statistics or data. Part or all of the overhead data may be stored in each page, as illustrated in FIG. 1b. Alternately part or all of the overhead data may be stored in a specific location within each block, or it may even be stored in a block separate from the user data.

One sector of data is most commonly included in each page but two or more sectors may instead form a page, or a page may be smaller than a sector. For example, U.S. Pat. Nos. 5,890,192 and 5,430,859 describe programming and reading data in units of chunks, in which a chunk is a fraction of a sector. In some memory systems, one sector is included in one page, and one page may form a block. More commonly, in NAND memory systems one or more sectors are included in each page, and 8, 16, or 32 pages form a block. In other memory systems blocks are formed from a relatively large number or pages such as 512, 1024, or even more pages. The number of blocks is chosen to provide a desired data storage capacity for the memory system. Array 11 is typically divided into a few sub-arrays (not shown), each of which contains a proportion of the blocks, which operate somewhat independently of each other in order to increase the degree of parallelism in the execution of various memory operations. An example of the use of multiple sub-arrays is described in U.S. Pat. No. 5,890,192, referenced earlier.

B. Writing Methods for Increased Endurance

As noted above, even though techniques exist for increasing the lifetime of EEPROM, flash and other forms of non-volatile memories, these memories still have finite lifetimes. This can limit the use of such memories in those applications requiring endurance beyond the number of safe re-write operations. As an exemplary embodiment that can be used to illustrate various aspects of the present invention, consider the case where the non-volatile memory 25 on the controller 128 or support and control circuits 19 on the memory 120 have a small non-volatile memory to hold a register value, control data (such as a counter to keep track of events on a memory), or other encoded data. As such, it may need to be updated more frequently than the typical storage elements of the array 11. Consequently, even if this special purpose memory is formed of the same technology as the storage elements of the array 11 of the non-volatile memory 124, it will be subjected to an increased number of write/erase cycles and wear out sooner, rendering the memory system inoperable even if the array 11 still has a significant remaining lifetime. Additionally, as such a counter or similar special purpose memory is relatively small, it may not have available as much leeway to use some of the techniques (wear leveling, re-mapping, etc.) that are often exploited to extend the usable life of array 11.

Although the invention is not limited to usage in a counter, this is a convenient example in which to illustrate various aspects of the invention. More generally, it is applicable to other forms of data as some of the primary aspects are largely related to re-encoding the data, in some ways similar to what is due when data is encoded based on a gray code, so that it can be written distributed across independently accessible memory portions. For example, the "counter" of the following discussion can more generally just be thought of as a register storing some sort of data encoded by the described schemes, so that the "count" contained in the register is more generally just some encoded data as opposed to a sequentially incremented value of a counter. As an example, the register could be storing, say, a set of random number used to generate encryption keys. Thus, instead of storing a sequentially incremented count, the random number will just be encoded as described in the various embodiments.

Continuing with the counter example, any change in the NVM 25 is represented with an increment (or decrement) in the counter value. One way to improve the counter's lifetime is to use a non-volatile memory with single bit access and encoded as a Gray counter. Although the use of a Gray coding may increase the lifetime somewhat, according to a principle aspect the present equally distributes the counts among the bits (in the single bit embodiments) or multi-bit fields. Since each bit is only erased when it is re-written, this reduces the number of changes in the ratio of the number of the bits.

The exemplary embodiments of the present invention include both single bit accessible embodiments and multi-bit (such as a byte) accessible embodiments. Which level of granularity of access is preferable depends on the particular application and considerations such as the amount of endurance required (expressible as the factor by which the needed level of endurance exceeds the level of endurance of the individual cells) and technological limitations of the cell or array technology employed. Single-bit access can provide the greater factor of lifetime amplification; however, such single-bit accessible non-volatile memories are not commonly used for a number of reasons. Among these are the relative complexity and increased area requirements needed for single-bit access, which can be limiting factors. Another method that can increase the endurance of the counter is to use the standard, full capacity non-volatile memory, but to use several separate modules and distribute data writes across several modules. However, even to improve endurance by a factor of two by distributing counter writes across two full capacity modules would require a very large amount of memory even for a very limited counter. In some respects, the present invention combines aspects of these two somewhat contrary approaches, but introduces a new method that will allow usage of low endurance non-volatile memory cells by using the advantage of a new counting method.

More specifically, according to one aspect, in one embodiment, the present invention uses a non-volatile memory accessible on a small granularity, such as with single-bit access or with multi-bit access, but for a relatively small number of bits. The memory can either be accessed at the same level as this granularity or, more generally, it may be accessed through a larger number of bits, but such that only the segments to be updated will be rewritten. The other segments accessed in this process will then not be subjected to the same level of wear as those of this write segment.

The following discussion is developed first for the exemplary embodiments of a memory with small but multi-bit (e.g. 8-bit) access. For example, the controller 128 could have a small, 256 bit non-volatile memory 25 of 32 such individual accessible 8-bit sections. According to another aspect, the data (here the count) is encoded similarly to what is done for a Gray count encoding, but in such a way the encoded count can be distributed across multiple ones of the 8-bit accessible memory segments such that if N such segments are used, a given segment is only rewritten for every Nth count. The typical motivation for Gray coding is to reduce power or make data less susceptible to corruption; although these are always important considerations, the motivation here is instead to more evenly distributes the re-writes. This will consequently increase the lifetime of the counter by a factor of N.

Figure 2:
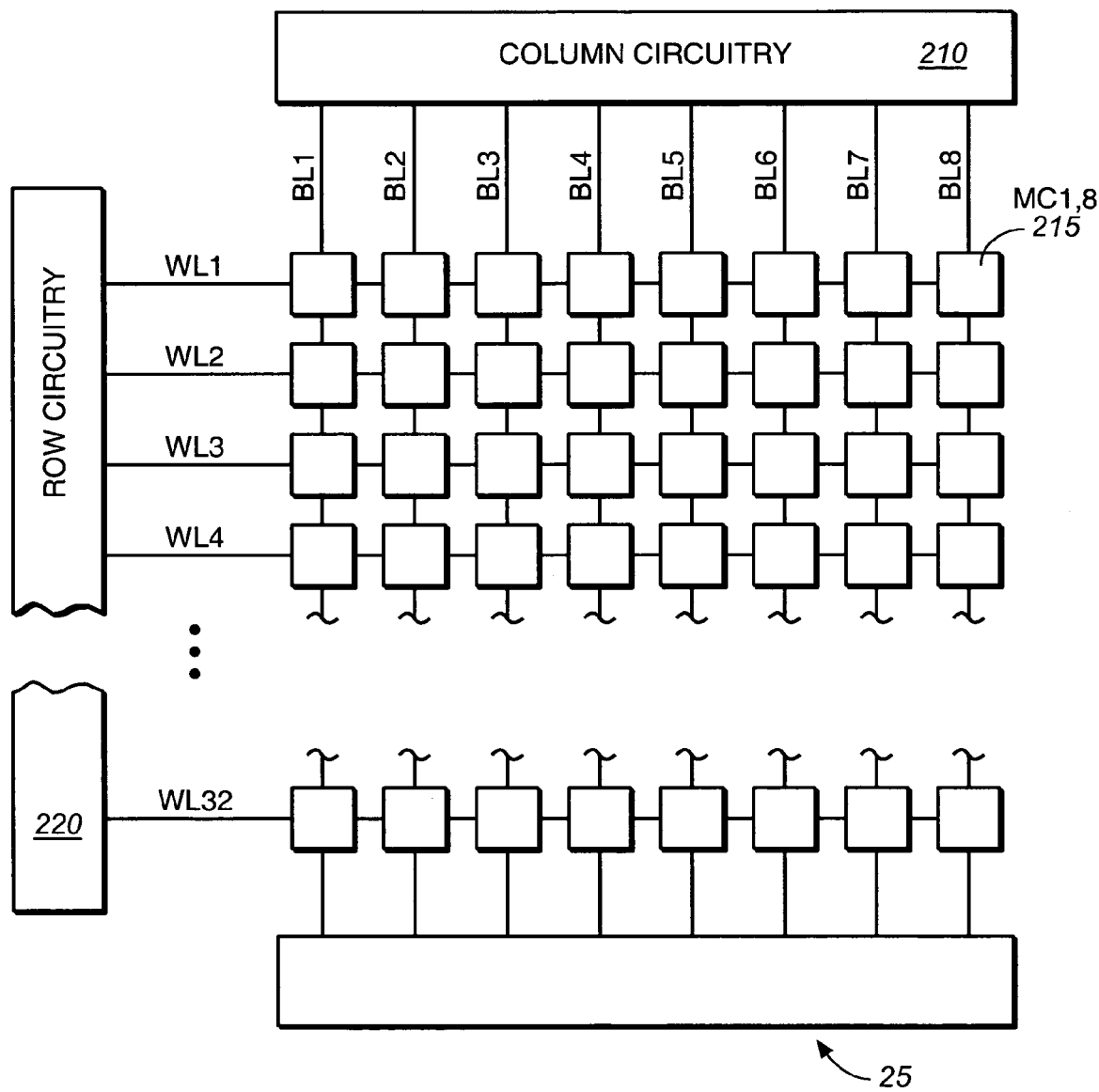
FIG. 2 is a block diagram of some elements of an exemplary non-volatile memory.

FIG. 2 is a schematic illustration of one example of the memory used in the present invention. As already discussed, this is a small non-volatile memory (NVM 25 in FIG. 1b) in the controller (128) or maybe in a state machine (in 19) on the memory (124). This particular example in FIG. 2 is a 256-bit memory formed along 32 rows (with corresponding word lines WL1–WL32) and 8 columns (along bit lines BL1–BL8), with the memory cells shown schematically as located at the intersections of the bit lines and word lines. For example, memory cell MC1,8 215 is on word line 1 at bit line 8. In the exemplary embodiment the cells are EEPROM cells as the formation of such cells integrates readily into the flash memory process of the flash memory of the exemplary mass storage memory 11. More generally, the memory cells may be formed of any of the various non-volatile memory technologies, such as those described in U.S. patent publication US-2005-0251617-A1. FIG. 2 shows only some select elements of the memory 25, where more detail on such memory structures can be found in the various patents and other documents mentioned herein. The specific elements shown include the column circuitry 210 and row circuitry 220 used for reading, writing, erasing and generally decoding the various cell addresses for accessing the array.

In the exemplary embodiment, four rows (such as WL1–WL4) are devoted to the counter, with the rest of memory 25 available to the controller as separate counters or other uses. In a multi-bit write segment embodiment, each write segment could consist of a row, such that each of the first four rows would then be one of individually accessible bytes across which the count is stored. In single-bit write segment embodiment, each cell could be individually rewritten.

The count is encoded in a way similar to, but not the same as a Gray counter. The invention does not use a conventional Gray counter because the Least Significant Byte would have to be rewritten with most counter updates. For example, on an 8-bit counter or higher counter, only on the 256th count will another byte be updated. Consequently, the counter as a whole sees little increase in endurance. In order to distribute the writing across the non-volatile cells, a new counting method will be used. The idea is to rewrite each byte as infrequently as possible.

The idea will be illustrated with the example of a 4-bit counter, where two of the bits are held in one of the individually accessible multi-bit accessible memory segments ("WS" or "Write Segment #1") and the other two bits are held in another ("WS #2"). The granularity of the memory access, or size of the write segments, may be the two bits used here, or it may be larger, say a byte, with only the two bits needed of each byte being used here. When each write segment is eight bits, with only two bytes are being used to store the count here, this example readily extends to a 16-bit counter, but the 4-bit example is used to simplify the explanation and only the values of the last two bits in each byte is indicated.

The equivalent count, encoded 4-bit count, and corresponding write of the bytes for the 4-bit counter of the exemplary embodiment is as follows:

| Equivalent Counting Value | Encoded 4-bit Counter | Order of Writing the Counts |
| --- | --- | --- |
| #0 | 0000 | (value on reset) |
| #1 | 0001 | Write to WS #1: 01 |
| #2 | 0101 | Write to WS #2: 01 |
| #3 | 0110 | Write to WS #1: 10 |
| #4 | 1010 | Write to WS #2: 10 |
| #5 | 1011 | Write to WS #1: 11 |
| #6 | 1111 | Write to WS #2: 11 |
| #7 | 1101 | Write to WS #1: 01 |
| #8 | 1001 | Write to WS #2: 10 |
| #9 | 1000 | Write to WS #1: 00 |
| #10 | 0100 | Write to WS #2: 01 |
| #11 | 0111 | Write to WS #1: 11 |
| #12 | 0011 | Write to WS #2: 00 |
| #13 | 0010 | Write to WS #1: 10 |
| #14 | 1110 | Write to WS #2: 11 |
| #15 | 1100 | Write to WS #1: 00 |

For the encoded count (middle column), the first two bits are the value stored in write segment #1 and the second two bits the value stored in write segment #2. As can be seen, all of the (here) 16 possible counter states are represented, but the order of the conventional counting is changed so that only one write segment is changed for each count. This is thus a sort of extension of the known Gray counting, but used for a different purpose and arranged so that for each count, only the first pair or the second pair of bits are changed in an alternating manner. In this example, the assumption is that each of the two bytes can erased separately, and only the byte to updated/written is erase prior to each write.

By alternating the writes between write segment #1 and write segment #2 in this way, a memory with half the required endurance can be used; that is, the endurance is doubled: For example, non-volatile memory with a safe 50K endurance can be used for an application needing a reliable count of 100K. Similarly, for a counter with up to 32 bits, by using four sections with 8-bit access a memory with only one fourth of the needed endurance can be used; or expressed differently, the lifetime is increased by a factor of four. (For example, a non-volatile memory with endurance of 25K writes can be used for total of expected maximum of 100K writes). In the 32-bit case, the equivalent count, encoded 32-bit count, and corresponding write of the bytes for the 32-bit counter using four individually accessible bytes is as follows for the first few counts:

| Equivalent Counting Value | Encoded 32-bit Counter (in hex) | Order of Writing the Counts |
| --- | --- | --- |
| #0 | 0000 0000 | |
| #1 | 0000 0001 | Write to byte #1: 0000 0001 |
| #2 | 0000 0101 | Write to byte #2: 0000 0001 |
| #3 | 0001 0101 | Write to byte #3: 0000 0001 |
| #4 | 0101 0101 | Write to byte #4: 0000 0001 |
| #5 | 0101 0102 | Write to byte #1: 0000 0010 |

The process continues on similarly to the 4-bit counter example above, until all combinations of the 32 bits are used, for an equivalent count of $(2^{32}-1)$, and the each of the four bytes equally accessed. Consequently, the endurance of the memory is increases by a factor of 4. In the table, the order of access is shown as being cyclical. More generally, other order can be used that evenly distributes the re-writes across the different fields, a cyclical order just being a simple implementation. For example, the access order of the write segments, the write order within each write segment, or both could use the sort of balanced Gray code described below.

The above can be extended to increase a memory's endurance even further. Using the 32-bit counter as an example, consider the case where the lifetime needs to be increased by more than a factor of four; alternately, this can be considered the case where a technology having capabilities with an endurance of less than a ¼ of that needed for the counter. For example, consider the case of using three fields of 32-bits accessible a byte at a time, for a total of 96-bits of non-volatile memory according to the following algorithm:

1) Assume 3 fields, #1, #2 and #3, each formed of a 32-bit counter having four individually accessible byte used as described above.
2) The writes are done to the lowest value number from the three counters with priority to the Lower field number (if two fields have the same value).
3) The reads will always done from the highest value number from the three counters.
4) The counting method to each field will be the same as given above.
5) Each write operation will be done on one byte out of the total 12 given bytes.

Therefore the required endurance will be in that case (Total #writes)/12.

Thus, for example, a counter with an endurance of 100k write cycles can be extracted from a non-volatile memory technology having 8K endurance.

More generally, the counter can be described as being made up of a number N of individually accessible, rewritable non-volatile memory portions or "Write Segments". In the examples, each individually accessible write segment consists is 1-byte. The count is then encoded as a corresponding N fields, where, as the count is incremented, these N fields are updated in a uniformly distributed manner; that is, one field is not re-written a second time before all the other fields have the same number of updates. As the goal is to increase endurance by reducing the number of re-writes, as described below with the single-bit embodiments, it is not necessary that the rewrites are strictly uniformly distrusted, but only substantially so; that is, in more general embodiments, the fields are updated so as to have only a substantially uniform distribution in order to produce some non-negligible reduction in the number of re-writes for the count or register value. Consequently, as the count is incremented, the N memory portions are then rewritten evenly distributed. This maximizes the endurance, increasing it by a factor of N. In the 4-bit counter example, the count is maintained as two 2-bit fields (one from each write segment), where each of the 2-bit fields corresponds to one of the two write segments. For the 32-bit counter, four 8-bit fields are used, corresponding to bytes #1–#4 in is example. By encoding in the way, the count changes only a single one of the N field—and, thus, its corresponding individually accessible portion of the memory—and this is done so that the accesses to the bytes are evenly distributed. This reduces the rate of wear by a factor of 1/N. Although other arrangements could be used, the exemplary embodiments all assign the same number of bits to each field (two fields of two for the 4-bit counter, four fields of eight for the 32-bit counter), so that the count is multiple of the number memory portions.

Figure 3:
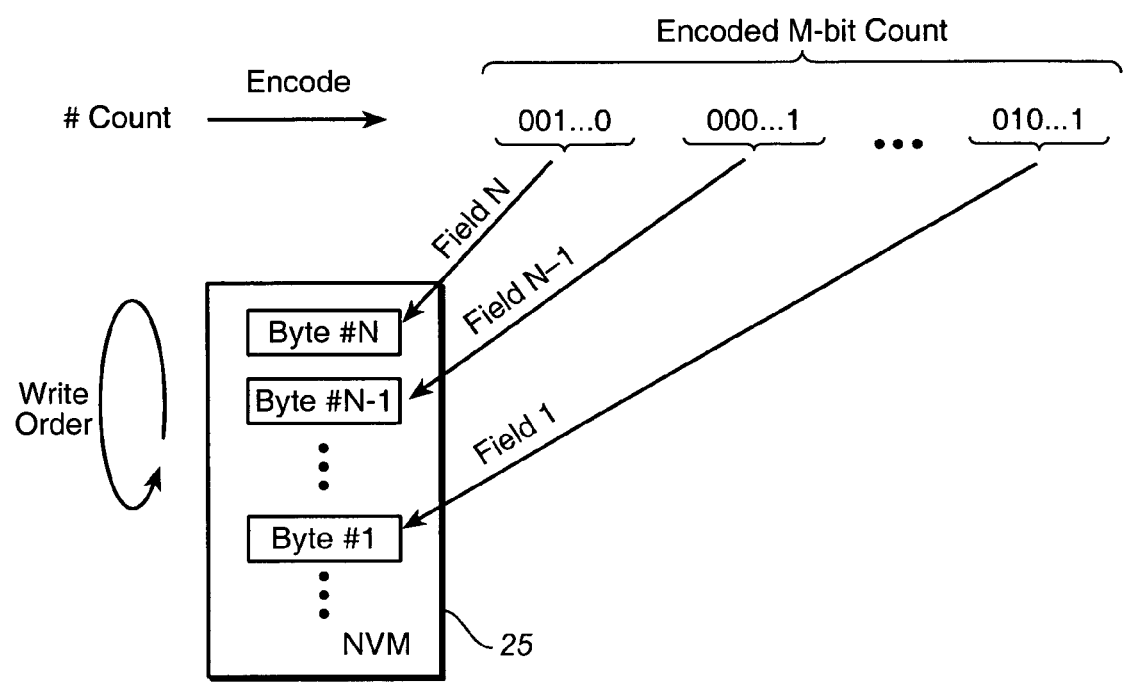
FIG. 3 is a schematic illustration of some primary aspects of one of the main embodiments.

FIG. 3 is a schematic illustration of some of these aspects for an embodiment using multi-bit write segments with a cyclic access pattern. As shown there, a count (#) is encoded as the M-bit count that is distributed across the N fields, the encoding being such that each time the count is incremented (or decremented) only a single field changes. (This differs from a standard Gray coding where each time the count is incremented only a single bit changes, but this would often be within the same field as the count is broken up here.) Each of the count fields is then stored in a corresponding section (here bytes #1–#N) of NVM 25. As the count is incremented, bytes #1–#N are rewritten with the new value of their corresponding field in the cyclically order shown. Although the arrows of the figure show how the count is encoded and written as it is incremented, reading the count basically reverses the process.

It should be noted that FIG. 3 is illustrative of a particular embodiment (multi-bit write segments with cyclic access) and actually implementations may vary. For instance, bytes #1–#N in which the count fields are written are shown as being placed adjacent in the memory NVM 25 or ordered consecutively, neither of which is actually required and it would often be likely that they are arranged otherwise. Also, all of the fields need not be the same size and need not be written in the cyclic order of the exemplary embodiments, although this is simplest and optimizes the extension of the counter's lifetime. In other embodiments, such as the single-bit access, balanced Gray code embodiment, the corresponding changes to FIG. 3 would be made.

Embodiments having single-bit access are presented next. As noted above, although not commonly used, single-bit access can provide the greater factor of lifetime amplification. In this example, each of the cells of the memory, such as NVM 25, can be individually accessed and rewritten. In the exemplary embodiment, these will again be EEPROM cells, although as before the other memory technologies described in U.S. patent publication US-2005-0251617-A1 can also be used. As this allows for the various writes as the count in incremented to be distributed with a finer granularity, there is the corresponding increase in lifetime. For example, in the case of the 32-bit counter of FIG. 2, if for each increment of the counter only one (or sometimes two) bits are rewritten while the other are left untouched, the lifetime is increased by over an order of magnitude.

As noted before, the count is encoded in a way somewhat like a Grey code; but in a Grey code, the goal is to allow a minimal number in change of bits as the count is incremented. This can make the encoded data less susceptible to error and allow minimal power consumption when data is written in this order; however, it is not optimal for the present application as the goal here is to minimize, and equalize, the number of re-writes for each bit in order to reduce wear. For example, for a 4-bit counter, a standard Gray code is as follows:

| Equivalent Count | Standard Gray Code |
|---|---|
| #0 | 0000 |
| #1 | 0001 |
| #2 | 0011 |
| #3 | 0010 |
| #4 | 0110 |
| #5 | 0111 |
| #6 | 0101 |
| #7 | 0100 |
| #8 | 1100 |
| #9 | 1101 |
| #10 | 1111 |
| #11 | 1110 |
| #12 | 1010 |
| #13 | 1011 |
| #14 | 1001 |
| #15 | 1000 |

As can be seen, the least significant bit (bit 0) changes every other write, or $2^3=8$ times, with each bit to the left written half as many times: bit 1 changes 4 times, bit 2 twice, and bit 3 once. More generally, for an n-bit counter, the least significant bit will change $2^{(n-1)}$ times while the most significant bit will change only once, which is only a slight improvement (by a factor of about 2) over a standard binary count where the LSB changes $2^n-1$.

This is contrary to the aims of the present invention. Instead consider the case where the changes are spread more uniformly:

| Equivalent Count | Uniformly Distributed Changes |
|---|---|
| #0 | 0000 |
| #1 | 0001 |
| #2 | 0011 |
| #3 | 0111 |
| #4 | 0110 |
| #5 | 1110 |
| #6 | 0010 |
| #7 | 1010 |
| #8 | 1000 |
| #9 | 0101 |
| #10 | 0100 |
| #11 | 1100 |
| #12 | 1101 |
| #13 | 1111 |
| #14 | 1011 |
| #15 | 1001 |

In this case, only one bit (or only occasionally two bits) is changed for each increment, with bits 0 and 3 being rewritten six times and bits 1 and 2 four times (including the change from 15 to 0). This shown encoding is just one of many examples that can be used, where the number of fields changed is minimized for each incrementation. (Minimized here meaning reduced as much as is conveniently implementable and may not necessarily be the absolute obtainable minimum.) More generally other evenly distributed codes, or balanced Gray codes, can also be used. (Such balanced Gray codes are developed in "Balanced Gray Codes", G. S. Bhat and C. D. Savage, *The Electronic Journal of Combinatorics* 3 (1996), #R25, pp 1–11, with a particular example of a cyclic Gray code being given in U.S. Pat. No. 2,632,058.)

In a particular example of a memory using a write unit of a single bit and using an equal or balanced access, the 32-bit counter of FIG. 2 is used. For a memory technology with a 15K endurance, this gives a safe count value of approximately 15K×32=480K. (The actual values will be somewhat lower as some incrementations may switch two bits.) An alternate way to consider this is that if the system needs a guaranteed safe count of 100k, by using a 17 bit counter this can lead to a requirement that the cells are safe to about 130K/17=~7.6K, well within the 15K number of safe re-writes per cell. As with the multi-bit access embodiments, the single bit embodiments allow for a non-volatile memory with an endurance of a know number of re-writes to be used in a counter having a greatly increased endurance by evenly distributing the re-writes across the write units.

Therefore, the present examples are to be considered as illustrative and not restrictive, and the invention is not to be limited to the details given herein, but may be modified within the scope of the appended claims.

It is claimed:

1. In a memory system including a plurality N of individually accessible sections of multiple erasable and re-programmable non-volatile memory cells, a method of storing a numerical value that comprises:
   encoding the numerical value as a binary value composed of N fields, such that for each incrementing the numerical value changes only a single one of said fields and the changes to the N fields are substantially uniformly distributed among the N fields as the numerical value is incremented; and
   storing the change to said single one of the N fields in a corresponding one of the N sections as the numerical value is incremented while leaving the other ones of the N fields unchanged.

2. The method of claim 1, wherein the changes to the N fields are cyclically distributed among the N fields as the numerical value is incremented.

3. The method of claim 1, wherein each of the individually accessible sections contains a byte of storage capability.

4. The method of claim 1, wherein said storing comprises storing the fields in binary form in the memory cells of the sections.

5. The method of claim 1, wherein each of the fields are of the same number of bits.

6. The method of claim 1, wherein the numerical value is a M-bit value, where M is a multiple of N.

7. The method of claim 1, wherein the memory system includes a controller portion and a memory portion and said individually accessible sections are formed on the controller.

8. The method of claim 7, wherein the numerical value corresponds to an event on the memory portion.

9. The method of claim 1, wherein the memory system includes a controller portion and a memory portion and said individually accessible sections are formed as part of a state machine on the memory portion.

10. The method of claim 1, wherein said memory cells of the individually accessible sections are EEPROM memory cells.

11. In a memory system having a plurality of N individually accessible, rewritable non-volatile segments, a method comprising:
    incrementing the value of a register;
    encoding the register value into a plurality of N binary fields, each of the fields corresponding to a respective one of the individually accessible, rewritable segments, where the encoding is such that as the register value is incremented the number of fields that change for each count is minimized and the changes to the fields are substantially uniformly distributed; and
    rewriting the incremented register value in the segments in which the respective field value has changed.

12. The method of claim 11, wherein the encoding uses a balanced Gray code.

13. The method of claim 11, wherein each of the individually accessible, rewritable segments is comprised of a plurality of memory cells.

14. The method of claim 13, wherein the changes to the N fields are cyclically distributed among the N fields as the register value is incremented.

15. The method of claim 13, wherein each of the individually accessible, rewritable segments contains a byte of storage capability.

16. The method of claim 11, wherein N is greater than or equal to three and each of the individually accessible, rewritable segments is comprised of a single memory cell.

17. The method of claim 16, wherein the encoding uses a balanced Gray code.

18. The method of claim 11, wherein each of the individually accessible, rewritable segments are of the same number of bits.

19. The method of claim 11, wherein the register value is a M-bit value, where M is a multiple of N.

20. The method of claim 11, wherein the memory system includes a controller portion and a memory portion and said individually accessible, rewritable segments are formed on the controller.

21. The method of claim 20, wherein the register value corresponds to an event on the memory portion.

22. The method of claim 11, wherein the memory system includes a controller portion and a memory portion and said individually accessible, rewritable segments are formed as part of a state machine on the memory portion.

23. The method of claim 11, wherein said individually accessible, rewritable segments are formed of EEPROM memory cells.

* * * * *